(12) United States Patent
Kim et al.

(10) Patent No.: US 7,995,171 B2
(45) Date of Patent: Aug. 9, 2011

(54) THIN FILM TRANSISTOR SUBSTRATE CAPABLE OF AVOIDING APERTURE REDUCTION

(75) Inventors: Chul Ho Kim, Yongin-Si (KR); Kook Chul Moon, Yongin-Si (KR); Jae Hyun Kim, Suwon-Si (KR); Ho Suk Maeng, Seoul (KR); Sang Hoon Lee, Seoul (KR); Kyung Hoon Kim, Uiwang-Si (KR); Keun Woo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 74 days.

(21) Appl. No.: 11/940,067

(22) Filed: Nov. 14, 2007

(65) Prior Publication Data

US 2008/0111956 A1 May 15, 2008

(30) Foreign Application Priority Data

Nov. 15, 2006 (KR) .................. 10-2006-0112859

(51) Int. Cl.
*G02F 1/1335* (2006.01)
*G02F 1/136* (2006.01)
(52) U.S. Cl. .................................... 349/114; 349/47
(58) Field of Classification Search .................... 349/114
See application file for complete search history.

(56) References Cited

U.S. PATENT DOCUMENTS

| 6,665,030 | B2 | | 12/2003 | Hanazawa et al. | |
|---|---|---|---|---|---|
| 7,391,489 | B2 | * | 6/2008 | Kume et al. | 349/129 |
| 7,532,263 | B2 | * | 5/2009 | Lee et al. | 349/38 |
| 2001/0004276 | A1 | * | 6/2001 | Urabe et al. | 349/106 |
| 2001/0020991 | A1 | * | 9/2001 | Kubo et al. | 349/113 |
| 2005/0083461 | A1 | * | 4/2005 | Yang et al. | 349/114 |
| 2005/0140877 | A1 | * | 6/2005 | Jeoung et al. | 349/114 |
| 2005/0200784 | A1 | | 9/2005 | Kume et al. | |
| 2006/0050210 | A1 | * | 3/2006 | Tsuchiya | 349/114 |
| 2006/0139528 | A1 | * | 6/2006 | Fujimori et al. | 349/114 |
| 2007/0109473 | A1 | * | 5/2007 | Higa et al. | 349/114 |

FOREIGN PATENT DOCUMENTS

| JP | 2002-311445 | 10/2002 |
|---|---|---|
| JP | 2005-258183 | 9/2005 |
| JP | 2006-011399 | 1/2006 |
| JP | 2006-099136 | 4/2006 |
| JP | 2006-153978 | 6/2006 |
| KR | 1020030058012 | 7/2003 |
| KR | 1020060034802 | 4/2006 |
| KR | 1020060069282 | 6/2006 |

* cited by examiner

*Primary Examiner* — Wen-Ying P Chen
(74) *Attorney, Agent, or Firm* — Innovation Counsel LLP

(57) ABSTRACT

A thin film transistor (TFT) substrate that is capable of providing a wide viewing angle and high contrast ratio without a decrease is aperture ratio is presented. The TFT substrate may be, for example, used with a patterned vertical alignment (PVA) mode LCD. The TFT substrate includes gate lines and data lines extending in non-parallel directions and a pixel electrode formed in a pixel region. The pixel region has two transmission regions separated from each other by a reflection region, and at least one of the gate lines is formed in the reflection region. A storage capacitor may also be formed in the reflection region. This configuration avoids the use of a bridge region between the two transmission regions that is responsible for aperture ratio decrease in the conventional configuration.

12 Claims, 12 Drawing Sheets

THIN FILM TRANSISTOR SUBSTRATE CAPABLE OF AVOIDING APERTURE REDUCTION

CROSS-REFERENCE TO RELATED APPLICATION(S)

This application claims priority from Korean Patent Application No. 10-2006-0112859 filed on Nov. 15, 2006, the content of which is incorporated by reference herein in its entirety.

BACKGROUND OF THE INVENTION

1. Field of Invention

The present invention relates to a liquid crystal display, and more particularly to a transflective liquid crystal display capable of reducing an aperture loss of a transmission region by forming a reflection region at a center of a pixel region.

2. Description of the Prior Art

A liquid crystal display (LCD) comprises a thin film transistor (TFT) substrate having pixel electrodes formed thereon, a color filter substrate having a common electrode formed thereon, and a liquid crystal layer interposed between the two substrates. The LCD displays an image by controlling the alignment of liquid crystal molecules, which is done by applying voltages to the pixel electrode and the common electrode. The amount of light transmitted through a liquid crystal layer is adjusted by the alignment of the LC molecules.

Since an LCD is not self-luminescent, light is supplied from the outside to form an image. LCDs are classified into transmissive, reflective and transflective types according to the type of light source. The transmissive LCD displays an image using a backlight positioned in the rear of an LCD panel, and the reflective LCD displays an image using ambient light. The transflective LCD, which is a combination of the transmissive and reflective LCDs, operates in a transmission mode when an image is displayed using a backlight unit incorporated into the LCD device when the amount of ambient light is insufficient to display the image of the desired quality and luminescence. The transflective LCD, however, operates in a reflection mode when there is enough ambient light. The transflective LCD is used for medium- and small LCDs. In the transflective LCD, a portion of a pixel region defines a transmission region, and the other portion of the pixel region defines a reflective region.

A vertical alignment mode LCD, in which the major axes of liquid crystal molecules are aligned vertically with respect to the TFT and color filter substrates in the absence of an electric field, has been receiving much attention because of its ability to achieve high contrast ratio and a wide viewing angle. In order to realize the wide viewing angle in the vertical alignment mode LCD, there is a method of forming a cut-away pattern or a projection on an electrode. According to such a method, a fringe field is formed and the directions in which liquid crystals are inclined are uniformly distributed, thereby securing a wide viewing angle. Particularly, a PVA (Patterned Vertical Alignment) mode, in which a cut-away pattern is formed on an electrode, has been recognized as a wide viewing angle technology with which an IPS (In Plane Switching) mode can be replaced.

In a transflective PVA LCD, in which the transflective and PVA modes are combined, and which is employed in medium and small products such as mobile phones, a transmission region is formed in a portion of a pixel region defined at an intersection region of gate and data lines, a reflection region is formed in the other portion of the pixel region, and a cut-away pattern is formed in the transmission region. In the transflective PVA LCD used for such medium and small products, the reflection region is formed in a gate line side of the pixel region with a TFT formed thereon, and the other portion of the pixel region is formed as the transmission region. However, if the transmission region is larger than the reflection region, the transmission region cannot be formed with a single domain due to the characteristics of the medium and small transflective PVA LCD. So, the transmission region is divided into two regions. In order to operate the LCD in a PVA mode by dividing the transmission region into two regions, the divided domains are spaced apart from each other. This configuration can be problematic in that it reduces the aperture ratio by the distance between the divided domains. Further, the two domains are bridged, and the liquid crystals in the bridge region are irregularly aligned so that no image is displayed in the bridge region. This reduction in the aperture ratio in the bridge region is undesirable.

SUMMARY OF THE INVENTION

The present invention is conceived to solve the aforementioned problems in the prior art. Accordingly, the present invention provides a thin film transistor (TFT) substrate capable of enhancing the aperture ratio, a method of manufacturing the same and a liquid crystal display (LCD) having the same.

The present invention is to provide a TFT substrate, in which a reflection region is formed at a central portion of a pixel region and a transmission region is formed symmetrically with respect to the reflection region to remove a bridge in the transmission region and thus reduce the aperture loss of the transmission region, a method of manufacturing the same and an LCD having the same.

The present invention is to provide a TFT substrate, capable of enhancing an aperture ratio by positioning gate and storage lines in a reflection region formed at a central portion of a pixel region, a method of manufacturing the same and an LCD having the same.

In one aspect, the present invention includes a TFT substrate that includes a plurality of gate lines extending in a first direction on an insulation substrate; a plurality of data lines extending in a second direction that is non-parallel to the first direction; and a pixel electrode formed in a pixel region between the data lines. The pixel region has transmission regions separated from each other by a reflection region, and at least one of the gate lines is formed in the reflection region.

In another aspect, the present invention is a method of manufacturing a TFT substrate that includes forming an active layer and a first electrode pattern by forming a semiconductor layer on a substrate and patterning the semiconductor layer; forming gate lines and a second electrode pattern by forming a gate insulation film and a first conductive layer on the substrate and patterning the first conductive layer; forming a first protection film on the substrate, forming a first contact hole that extends through the first protection film to the active layer; forming data lines by forming a second conductive layer on the substrate and patterning the second conductive layer to be connected to a portion of the active layer through the first contact hole; forming a second contact hole that extends through the second protection film to the active layer; forming a pixel electrode by forming a third conductive layer on the substrate and patterning the third conductive layer to be connected to a portion of the active layer through the second contact hole; and forming a reflection film on the pixel electrode.

In yet another aspect, the present invention is a liquid crystal display that includes the above-described TFT substrate, a color filter substrate, and a liquid crystal layer interposed between the TFT and color filter substrates. The color filter substrate includes a second insulation substrate having a first region that does not overlap the pixel region when the color filter substrate is aligned with the TFT substrate and a second region that overlaps the pixel region when the color filter substrate is aligned with the TFT substrate, a black matrix formed in the first region, a color filter formed in the second region, and a common electrode formed on the second insulation substrate.

BRIEF DESCRIPTION OF THE DRAWINGS

The above and other objects, features and advantages of the present invention will become apparent from the following description of a preferred embodiment given in conjunction with the accompanying drawings, in which.

DETAILED DESCRIPTION OF THE PREFERRED EMBODIMENT

Figure 1:
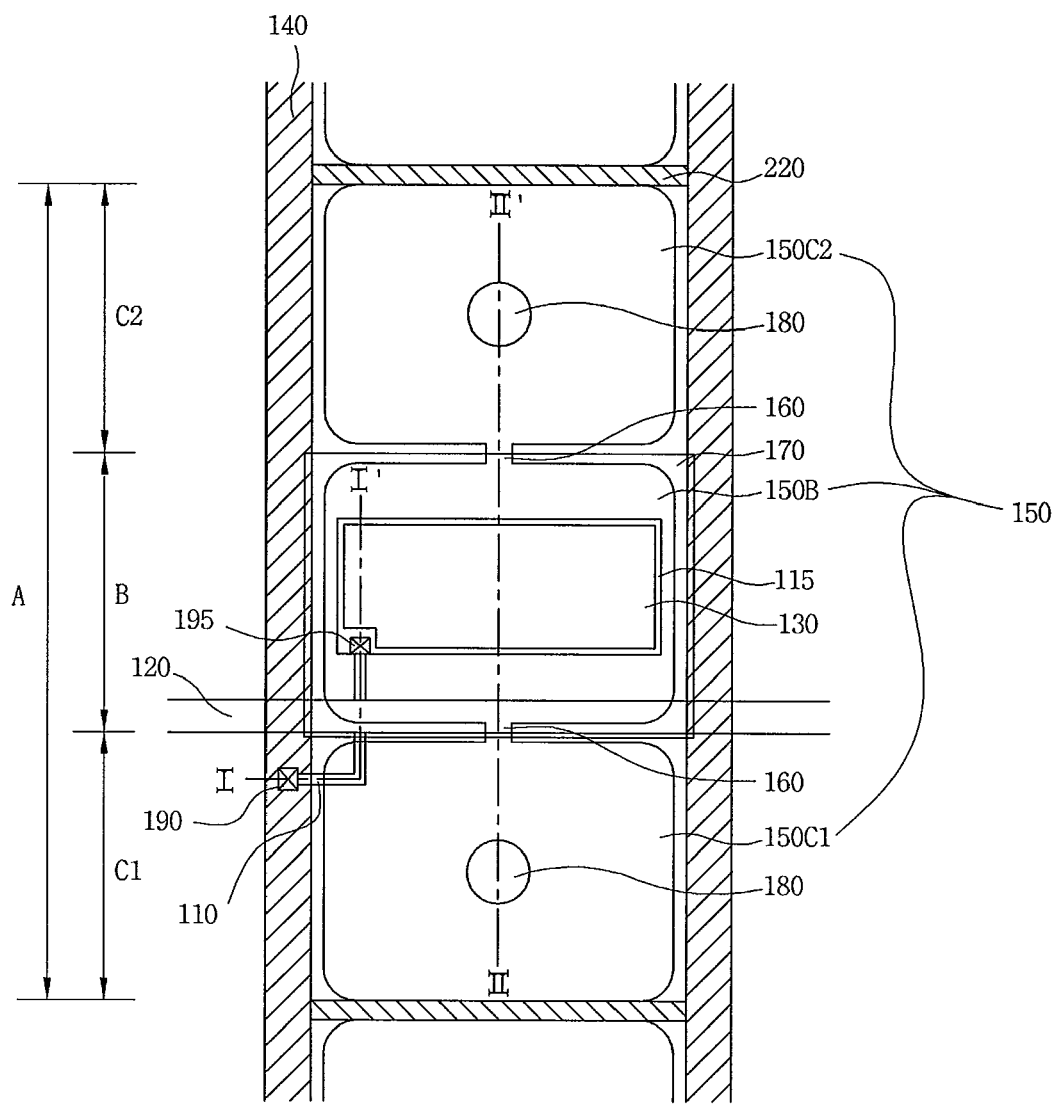
FIG. 1 is a plan view of a liquid crystal display according to the present invention.

Hereinafter, preferred embodiments of the present invention will be described in detail with reference to the accompanying drawings. However, the present invention is not limited to the embodiments and may be embodied in different forms. These embodiments are provided only for illustrative purposes and a full understanding of the scope of the present invention by those skilled in the art.

In the drawings, the thicknesses of layers and regions are exaggerated for clarity, and like reference numerals are used to designate like elements throughout the specification and drawings. Further, the expression that an element such as a layer, region, substrate or plate is placed on or above another element includes not only a case where a first element is placed directly on or just above a second element but also a case where a third element is interposed between the first element and the second element.

Figure 2:
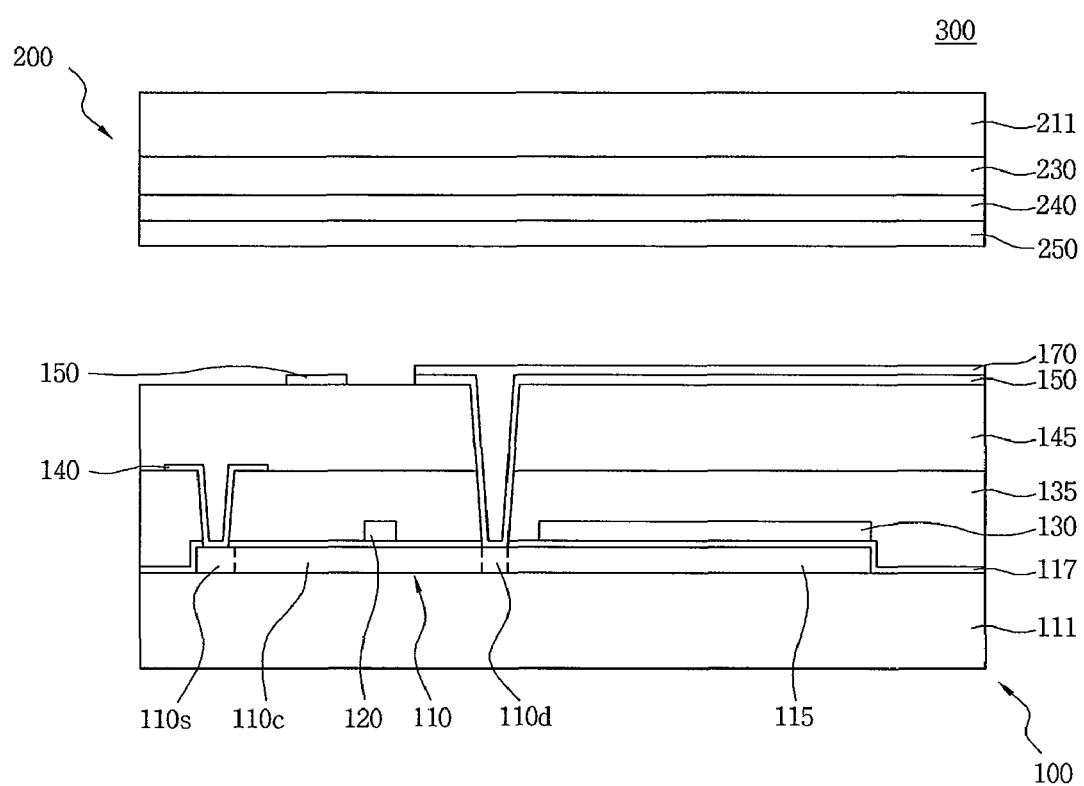
FIG. 2 is a sectional view taken along the line I-I' in FIG. 1.
Figure 3:
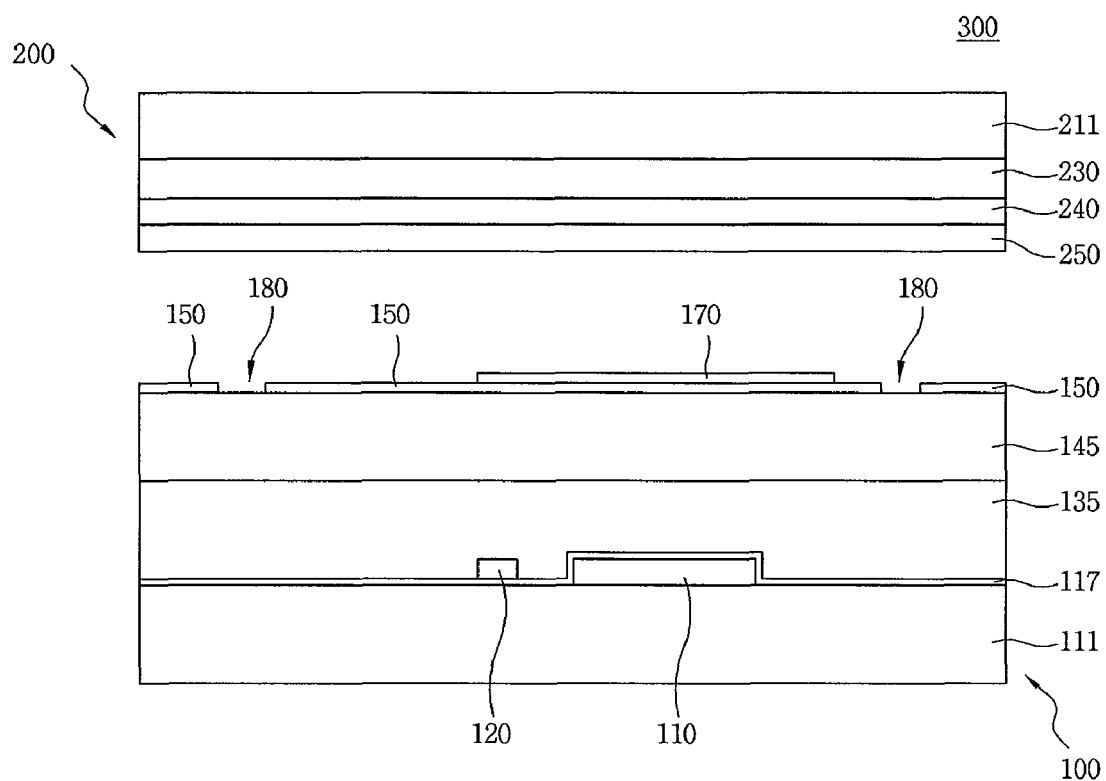
FIG. 3 is a sectional view taken along the line II-II' in FIG. 1.

FIG. 1 is a plan view showing a pixel region of a transflective PVA liquid crystal display (LCD) according to the present invention, FIG. 2 is a sectional view taken along the line I-I' in FIG. 1, and FIG. 3 is a sectional view taken along the line II-II' in FIG. 1.

An LCD panel 300 includes a thin film transistor (TFT) substrate 100 and a color filter substrates 200, having a liquid crystal layer (not shown) interposed between them.

The TFT substrate 100 comprises an active layer 110 formed on a first insulation substrate 111, a first electrode pattern 115 formed to be connected to a portion of the active layer 110, a plurality of gate lines 120 formed to extend in one direction, a second electrode pattern 130 extending parallel to the gate lines 120 to overlap with the first electrode pattern 115, a plurality of data lines 140 formed to extend in the direction perpendicularly intersecting the gate lines 120, and a pixel electrode 150 formed in a pixel region A between the data lines 140. As shown, the pixel region A has three regions: a reflection region B between transmission regions C1 and C2. That is, the reflection region B is defined at the central portion of the pixel region A including a region in which the gate line 120 and the second electrode pattern 130 are formed, and the transmission regions C1 and C2 are symmetrically formed with respect to the reflection region B in parts of the pixel region A that is not occupied by the reflection region B. In addition, a reflection film 170 is formed on a surface of the pixel electrode 150 that is formed in the reflection region B, preferably having an area larger than the pixel electrode 150 in the reflection region B. A cut-away portion 180 is further formed in the shape of a circle, preferably in the pixel electrode 150 at each central portion of the transmission regions C1 and C2. Here, it is preferred that an upper surface of the reflection film 170 formed in the reflection region B be curved so that a reflection surface extends. The reflection region B and the two transmission regions C1 and C2 of the pixel region A are defined by the pixel electrode 150, which is divided into sub-electrodes 150C1, 150B, and 150C2 spaced apart from each other by a predetermined interval.

The active layer 110 is formed to extend from a region under the data line 140 to a region of the first electrode pattern 115 such that the active layer 110 partially overlaps the data line 140 and the gate line 120. Further, the active layer 110 is connected to the data line 140 through a first contact hole 190, and connected to the pixel electrode 150 through a second contact hole 195. Furthermore, the active layer 110 is formed of a low-temperature polysilicon thin film. The region connected to the data line 140 through the first contact hole 190 functions as a source region 110s, a region connected to the pixel electrode 150 through the second contact hole 195 functions as a drain region 110d, and the other region except the source and drain regions 110s and 110d functions as a channel region 110c. Thus, impurity ions are implanted into the regions that will function as the source and drain regions 110s and 110d of a low-temperature polysilicon thin film. Further, the gate line 120 passing a top of the channel region 110c functions as a gate electrode. Accordingly, a TFT is configured.

The first electrode pattern 115, which functions as a lower electrode of a storage capacitor, may be formed in the shape of a rectangle, and simultaneously formed with the active layer 110 of a low-temperature polysilicon thin film. Further, the first electrode pattern 115 is formed to be connected to the drain region 110d of the active layer 110.

The gate lines 120 extend in a first direction and are spaced apart from one another at a predetermined interval. Further, the gate line 120 is insulated from the active layer 110 formed below the gate line 120 by a gate insulation layer 117.

The second electrode pattern 130 functions as an upper electrode of a storage capacitor. Preferably, the second electrode pattern 130 is formed simultaneously with the gate line 120 and overlaps the first electrode pattern except in a region where the second contact hole 195 will be formed. The second electrode pattern 130, the first electrode pattern 115 and the gate insulation layer 117 interposed therebetween constitute the storage capacitor.

The first protection film 135 is formed over an entire top surface of the first insulation substrate 111 including the gate line 120, and may be formed of an inorganic material, such as silicon nitride or oxide, or an organic insulation material with a low dielectric constant. The first protection film 135 may be formed to have a double-layered structure of an inorganic insulation layer and an organic insulation layer.

The first contact hole 190 is formed by partially removing the first protection film 135 and the gate insulation film 117 such that the source region 110s of the active layer is at the base of the first contact hole 190.

The data line 140 extends in the direction perpendicularly intersecting the gate line 120, and the data line 140 is connected to the source region 110s through the first contact hole 190. Accordingly, the data line 140 also functions as a source electrode.

A second protection film 145 is formed over an entire top surface of the first insulation substrate 111 including the data line 140. Like the first protection film 135, the second protection film 145 may be formed of an inorganic material such as silicon nitride or oxide, or an organic insulation material with a low dielectric constant. As in the first protection film 135, the second protection film 145 may be formed to have a double-layered structure of an inorganic insulation film and an organic insulation film. Further, an upper surface of the second protection film 145 is preferably curved in the reflection region B, and may be curved in the transmission regions C1 and C2.

The second contact hole 195 is formed by partially removing the second protection film 145, the first protection film 135 and the gate insulation film 117 such that the drain region 110d of the active layer 110 is at the base of the second contact hole 195.

The pixel electrode 150 is formed in the pixel region A between the data lines 140. The pixel electrode 150 is divided into the three sub-electrodes 150C1, 150B, 150C2 (collectively sub-electrodes 150) in the shape of a rectangle with rounded corners. The sub-electrodes 150C1, 150B, 150C2 are respectively formed in the reflection region B and the transmission regions C1 and C2. Further, the pixel electrode 150 is connected to the drain region 110d through the second contact hole 195. Accordingly, the pixel electrode 150 also functions as a drain electrode. Meanwhile, the pixel electrode 150 is formed of a transparent conductor such as ITO (Indium Tin Oxide) or IZO (Indium Zinc Oxide). Pixel sub-electrodes 150B, 150C1 and 150C2 of the pixel electrode 150 respectively formed in the reflection region B and the transmission regions C1 and C2 are electrically connected through connection portions 160 made of a transparent conductive material and simultaneously formed together with the pixel electrode 150. Since the transmission regions C1 and C2 are arranged such that the reflection region B is interposed between them and the pixel sub-electrodes 150B, 150C1 and 150C2 are formed in the respective regions, the pixel sub-electrodes 150C1 and 150C2 in the transmission regions C1 and C2 need not be spaced apart from each other with a bridge region in between. Accordingly, it is possible to prevent the aperture loss corresponding to the spaced distance.

The reflection film 170 is formed on a surface of the pixel electrode 150 in the reflection region B, and preferably has an area larger than the pixel sub-electrode 150B formed in the reflection region B. Further, it is preferred that the upper surface of the reflection film 170 be curved along the curved portion of the second protection film 145.

In addition, the cut-away portion 180, which is a domain regulating means for controlling the orientation of liquid crystals, is formed in each of the pixel sub-electrodes 150C1 and 150C2 in the transmission regions C1 and C2. Preferably, the cut-away portion 180 is formed in the shape of a circle at each central portion of the pixel sub-electrodes 150C1 and 150C2 in the transmission regions C1 and C2. This is to uniformly control the orientation of liquid crystals in the pixel sub-electrodes 150C1 and 150C2. As mentioned above, the pixel sub-electrodes 150C1 and 150C2 generally have the shape of a rectangle with rounded corners. In some embodiments, the pixel sub-electrodes 150C1 and 150C2 may include projections rather than the cut-away portions 180.

The color filter substrate 200 includes a black matrix 220, a color filter 230, an overcoat film 240 and a common electrode 250, which are formed on a second insulation substrate 211.

The black matrix 220 is formed to prevent light from leaking to regions outside the pixel region and optically interfering with adjacent pixel regions. Thus, the black matrix 220 is formed along the boundaries of the pixel electrode 150. No black matrix 220 is formed in the pixel region A of the TFT substrate 100. In more detail, the black matrix 220 is formed in a region corresponding to the data lines 140 of the TFT substrate 100, and in a region corresponding to a space between the pixel electrode 150 and neighboring pixel electrodes.

The color filters 230 are formed such that red, green and blue filters are repeated with the black matrix 220 as a boundary between the repeating units. The color filter 230 functions to provide color to the light emitted from a light source that passes through the liquid crystal layer (not shown). The color filter 230 may be formed of a photosensitive organic material.

The overcoat film 240 is formed on the color filters 230 and parts of the black matrix 220 that are not covered by the color filters 230. The overcoat film 240 serves to protect and planarize the color filters 230, and may be formed of an acryl-based epoxy material.

The common electrode 250 is formed on the overcoat film 240. The common electrode 250 is made of a transparent conductive material such as ITO (Indium Tin Oxide) or IZO (Indium Zinc Oxide). The cut-away pattern (not shown) may be formed in the common electrode 250. The cut-away pattern (not shown) of the common electrode 250 serves to divide the liquid crystal layer (not shown) into a plurality of domains together with the cut-away portion 180 of the pixel electrode 150.

Hereinafter, a method of manufacturing the TFT substrate of the LCD so configured according to the present invention will be described with reference to FIGS. 4 to 8.

FIGS. 4A to 8A are plan views illustrating the method of manufacturing the TFT substrate according to the present invention, FIGS. 4B, 5B, 6B, 7B, and 8B are sectional views taken along the line I-I' in FIGS. 4A, 5A, 6A, 7A, and 8A, respectively, and FIGS. 4C, 5C, 6C, 7C, and 8C are sectional views taken along the line II-II' in FIGS. 4A, 5A, 6A, 7A, and 8A, respectively.

Figure 4A:
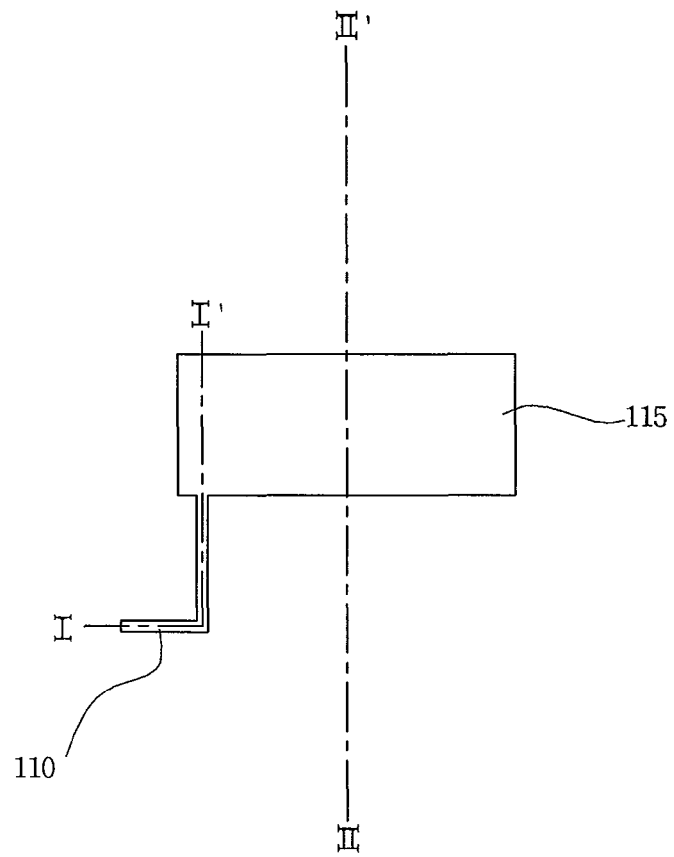
FIGS. 4 to 8 are plan and sectional views sequentially illustrating a method of manufacturing a thin film transistor substrate according to the present invention.
Figure 4B:
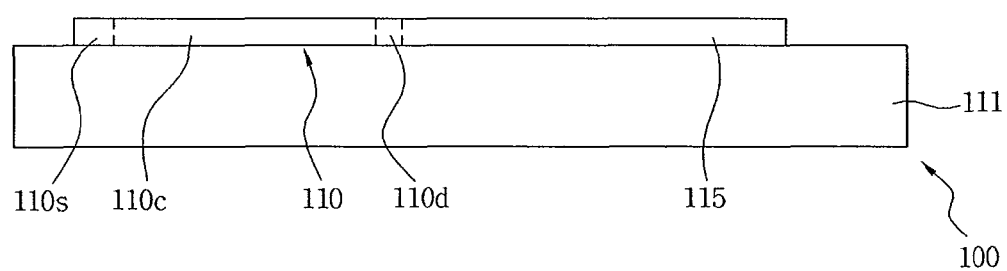
Figure 4C:
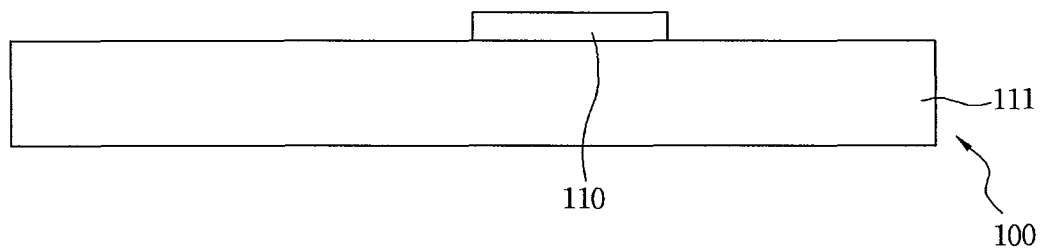

Referring to FIGS. 4A to 4C, a semiconductor layer is formed on the first insulation substrate 111, which is transparent. The semiconductor layer is formed of a low-temperature polysilicon thin film, which is made by forming an amorphous silicon thin film and crystallizing it at a low temperature. Here, SPC (Solid Phase Crystallization), ELC (Excimer Laser Crystallization), MIC (Metal Induced Crystallization) or the like is widely used for crystallizing an amorphous silicon thin film as a low-temperature polysilicon thin film. Thereafter, the semiconductor layer is patterned through a photolithography and etching process using a first mask. The semiconductor layer is patterned in the shape of a rectangle in a predetermined region and extends from the predetermined region as an extension portion having a predetermined width. That is, the semiconductor layer is formed to extend from the region patterned in the shape of a rectangle to where the data lines 140 will be formed, passing through where the gate lines 120 will be formed. Here, the portion of the semiconductor layer patterned in the shape of a rectangle is the first electrode pattern 115, and the extension portion of the semiconductor layer is the active layer 110 in which the source, drain and channel regions will be formed. Further, impurity ions are implanted into predetermined regions of the active layer 110, i.e., a region overlapping where the data lines 140 will be formed and a region connected to the first electrode pattern 115. After the impurity ions are implanted, the implanted impurity ions are activated using an excimer laser or the like. Here, the regions of the active layer 110 into which the impurity ions are implanted become the source and drain regions 110s and 110d, and the other region becomes the channel region 110c. The active layer 110 and the first electrode pattern 115 are formed through such processes. In the meantime, impurity ions may be implanted into the first electrode pattern 115.

Figure 5A:
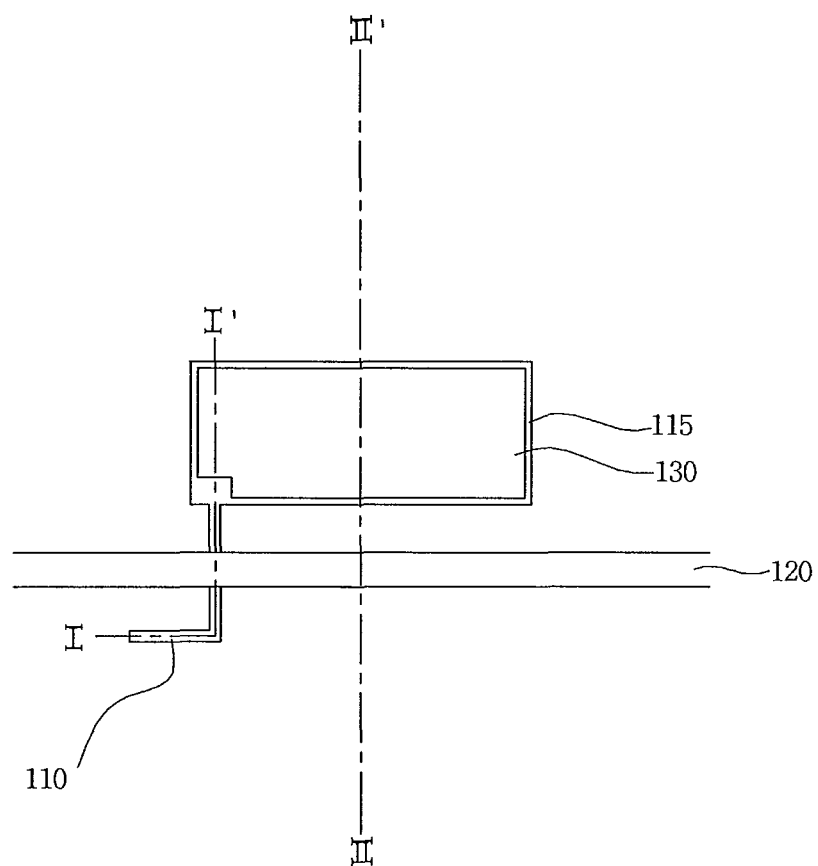
Figure 5B:
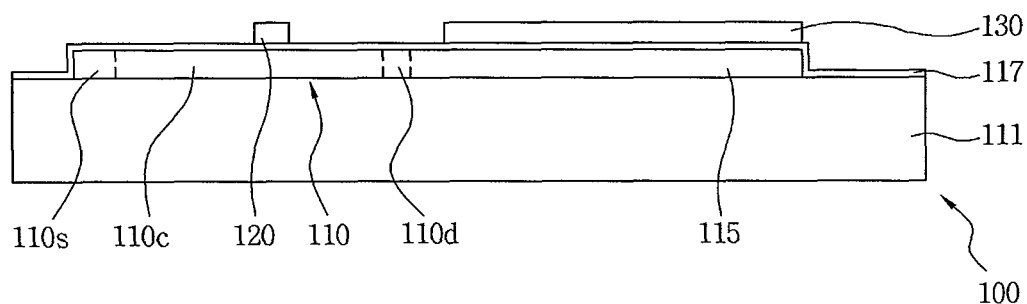
Figure 5C:
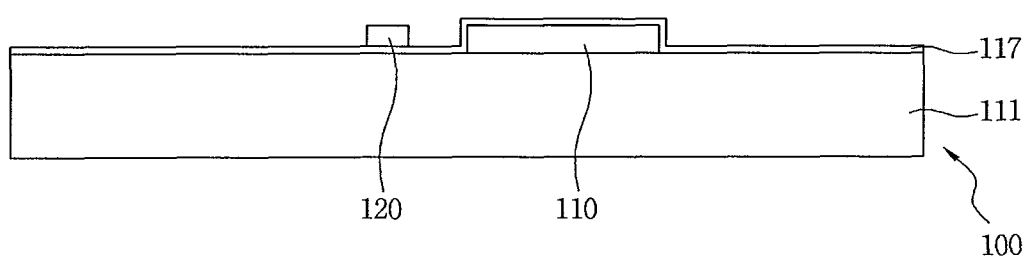

Referring to FIGS. 5A to 5C, the gate insulation film 117 is formed on top of the first insulation substrate 111 on which the active layer 110 having the source, drain and channel regions 110s, 110d and 110c formed and the first electrode pattern 115 are formed. The gate insulation film 117 is formed, for example, of silicon based insulation, such as silicon oxide or nitride. Further, a first conductive layer is formed on the first insulation substrate 111. Here, it is preferred that the first conductive layer be formed of any one metal of Al, Nd, Ag, Cr, Ti, Ta and Mo, or an alloy thereof. Further, the first conductive layer may be formed in not only a single-layered structure but also a multiple-layered structure having a plurality of metal layers. That is, the first conductive layer may be formed as a double-layered structure including a metal layer of Cr, Ti, Ta, Mo or the like having superior physical and chemical characteristics, and another Al or Ag based metal layer having low specific resistance. Further, the first conductive layer is patterned through a photolithography and etching process using a second mask, thereby forming the gate lines 120 and the second electrode pattern 130. Here, the gate lines 120 are formed to extend in one direction. Further, the second electrode pattern 130 is formed spaced apart from the gate line 120 at a predetermined interval, and to overlap the first electrode pattern 115 while exposing the drain region 110d. Meanwhile, the second electrode pattern 130 and the first electrode pattern 115 constitute a storage capacitor with the gate insulation film 117 interposed between the first and second electrode pattern 115 and 130.

Figure 6A:
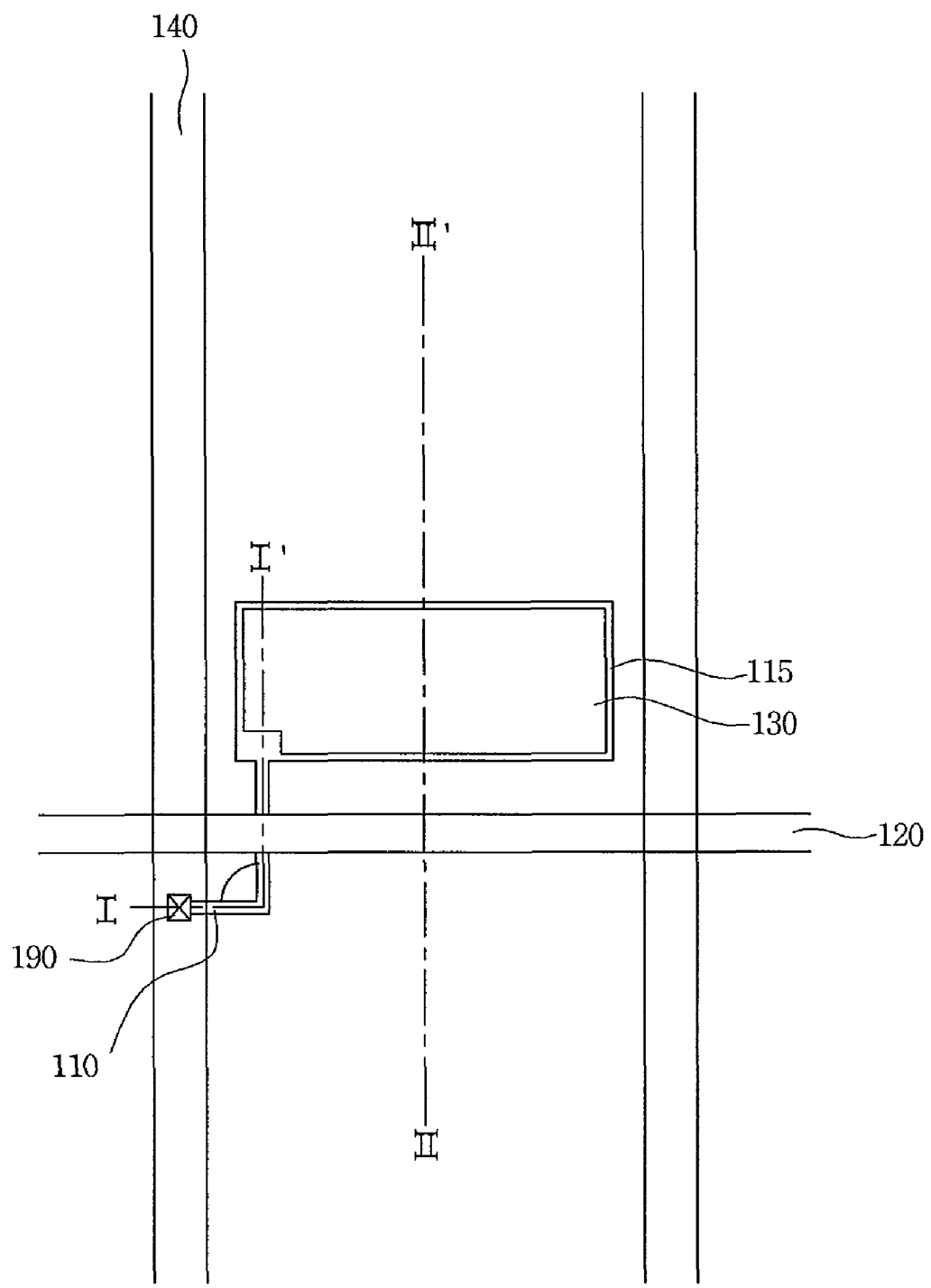
Figure 6B:
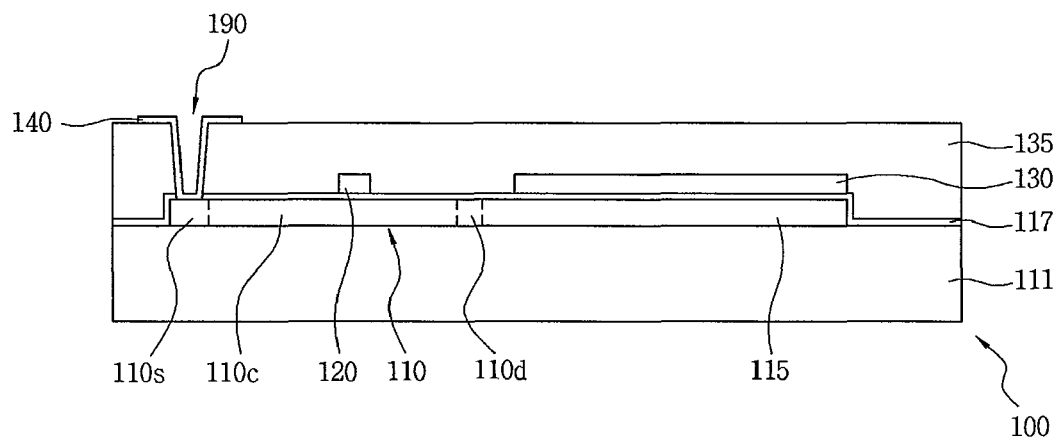
Figure 6C:
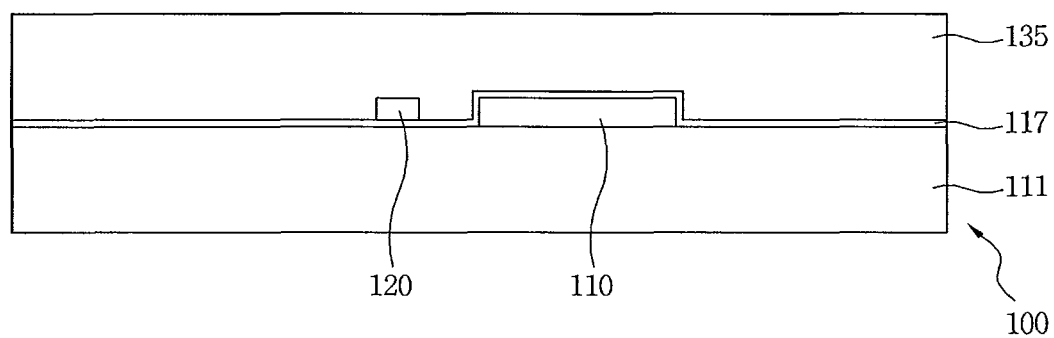

Referring to FIGS. 6A to 6C, the first protection film 135 is formed on the first insulation substrate 111 having the gate line 120 and the second electrode pattern 130 formed thereon. Here, the first protection film 135 may be formed of an inorganic material such as silicon nitride or oxide, and formed of an organic insulation material with a low dielectric constant. Further, the first protection film 135 may be formed in a double-layered structure of an inorganic insulation layer and an organic insulation layer. The first protection film 135 and the gate insulation film 117 formed thereunder are etched through a photolithography and etching process using a third mask to form the first contact hole 190 extending to the source region 110s of the active layer 110. Further, a second conductive layer is formed on top of the first insulation substrate 111. The second conductive layer is formed of the material used to form the first conductive layer. The second conductive layer is patterned through a photolithography and etching process using a fourth mask so as to form the data lines 140. The data lines 140 extend in a direction that is substantially perpendicular to the gate lines 120. Further, the second conductive layer is connected to the source region 110s through the first contact hole 190. Thus, the data line 140 also functions as a source electrode.

Figure 7A:
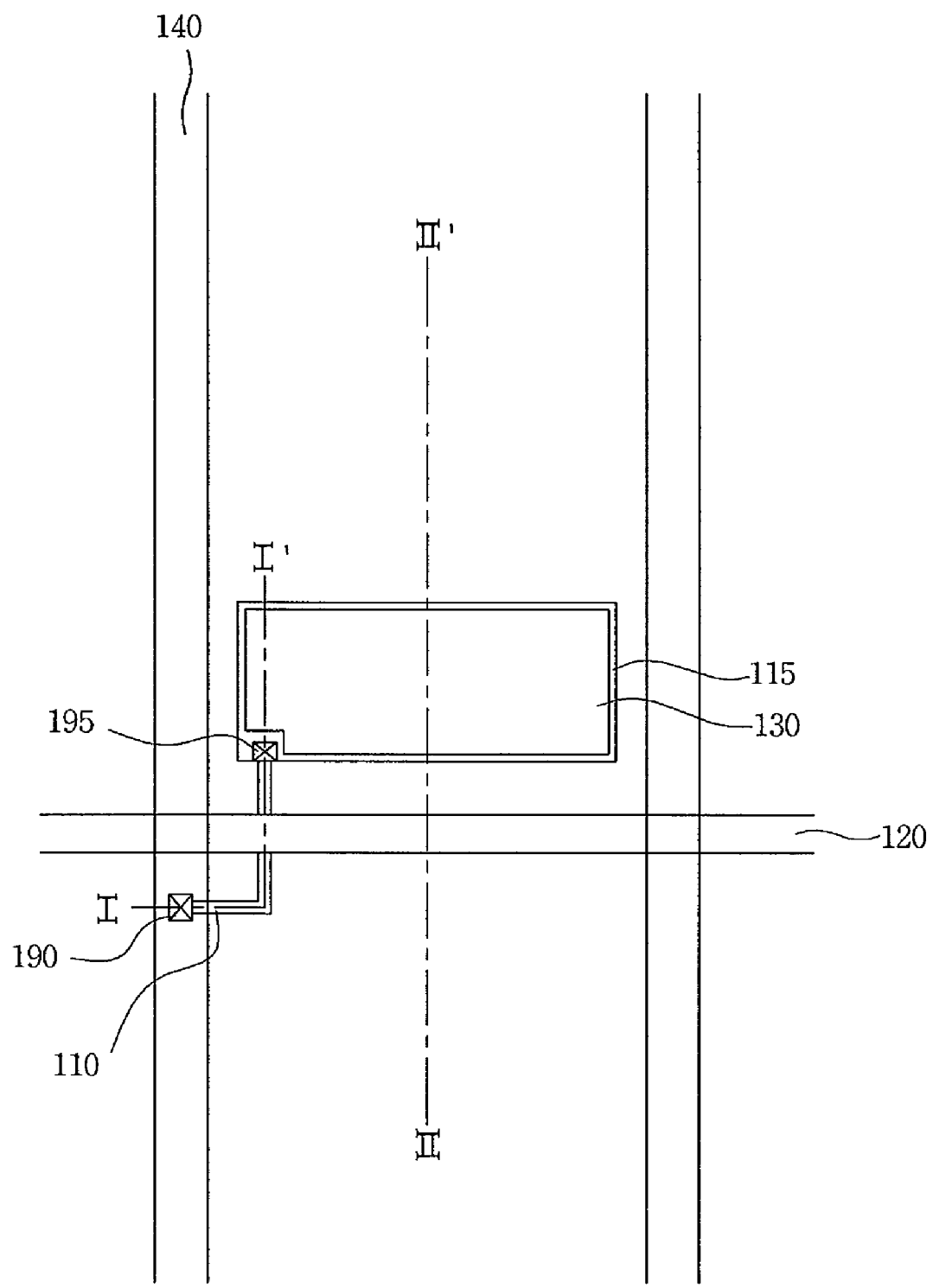
Figure 7B:
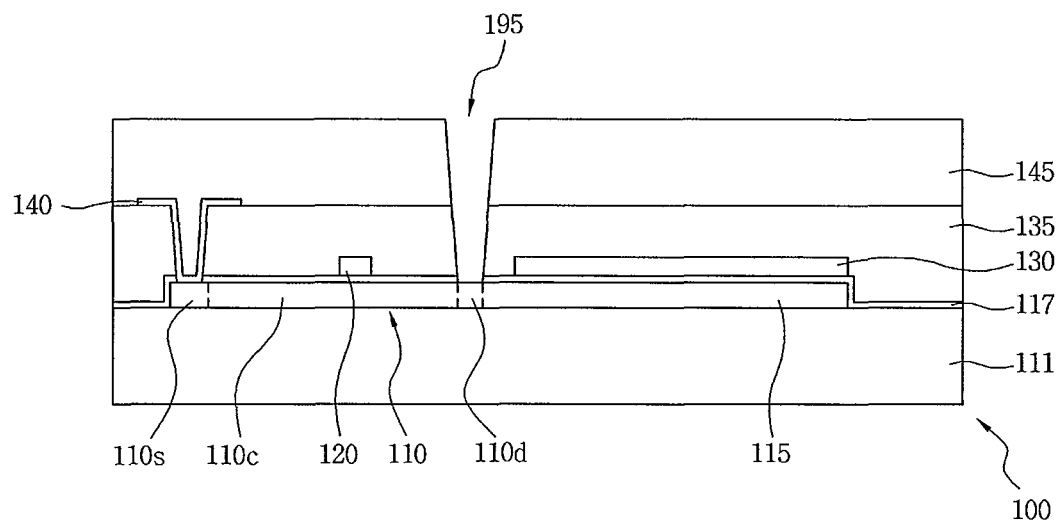
Figure 7C:
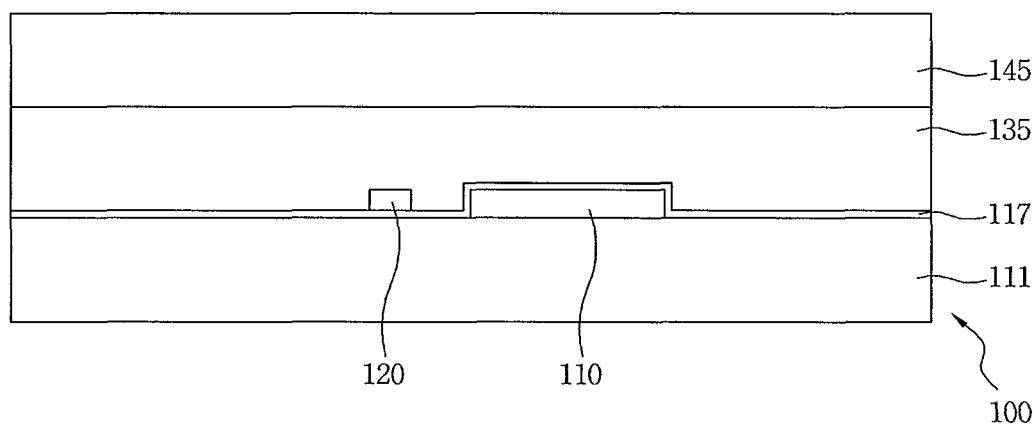

Referring to FIGS. 7A to 7C, the second protection film 145 is formed on the first insulation substrate 111 having the data lines 140 formed thereon. Like the first protection film 135, the second protection film 145 may be formed of an inorganic material such as silicon or nitride oxide, or an organic insulation organic insulation with a low dielectric constant. The second protection film 145 may be formed in a double-layered structure of inorganic and organic insulation films. Further, it is preferred that the second protection film 145 in the reflection region B be curved, and the second protection film 145 in the transmission regions C1 and C2 may also be curved. In addition, the second protection film 145, the first protection film 135 and the gate insulation film 117 are etched through a photolithography and etching process using a fifth mask to form the second contact hole 195 that extends to the drain region 110d of the active region 110.

Figure 8A:
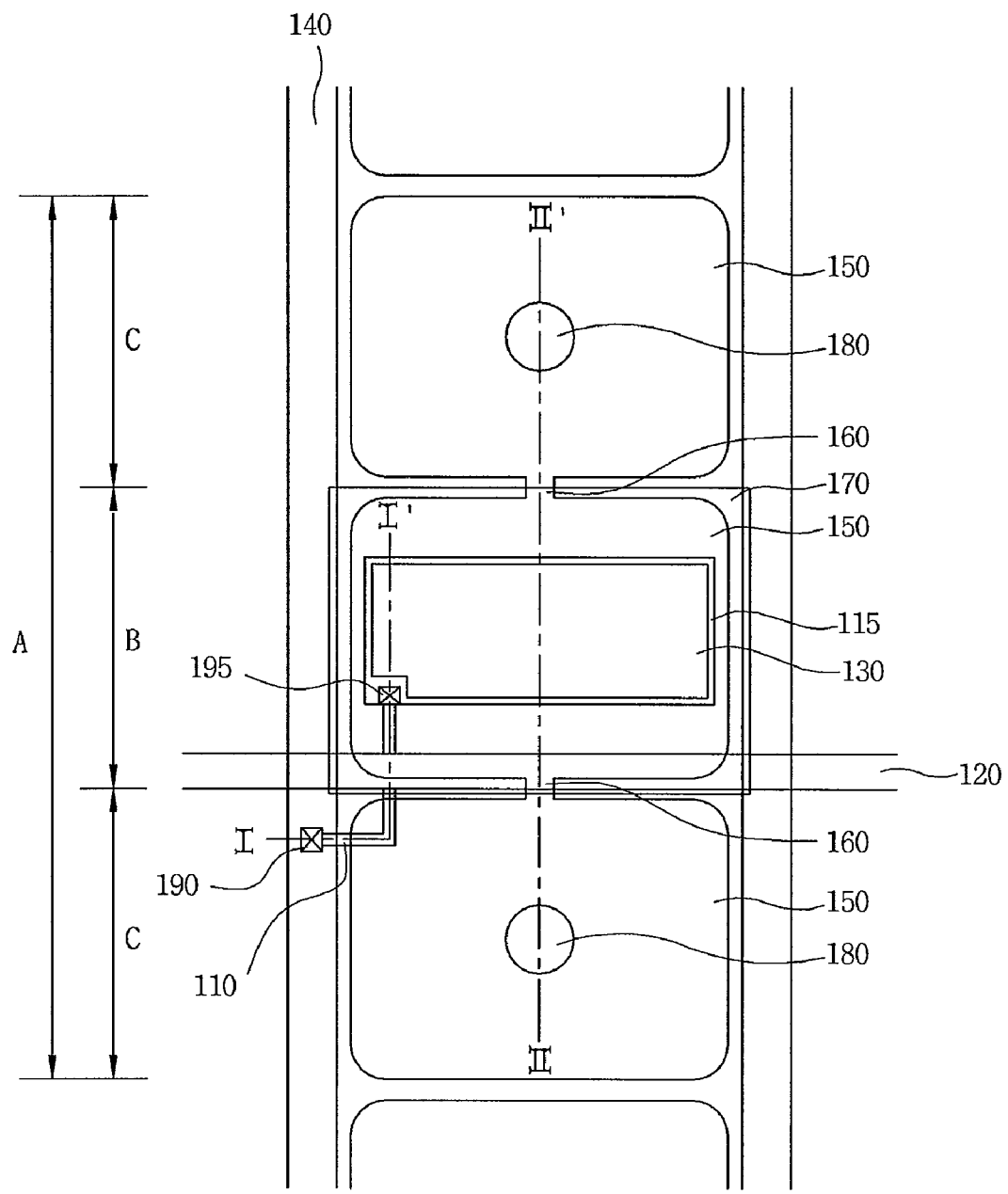
Figure 8B:
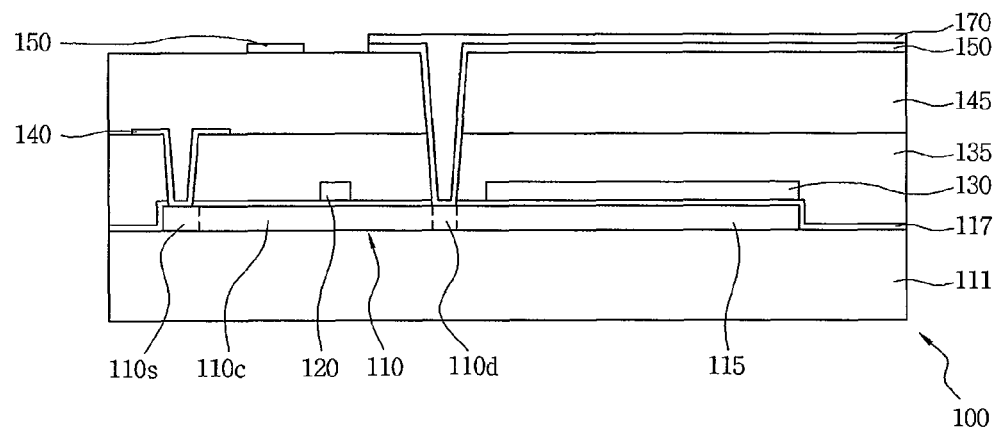
Figure 8C:
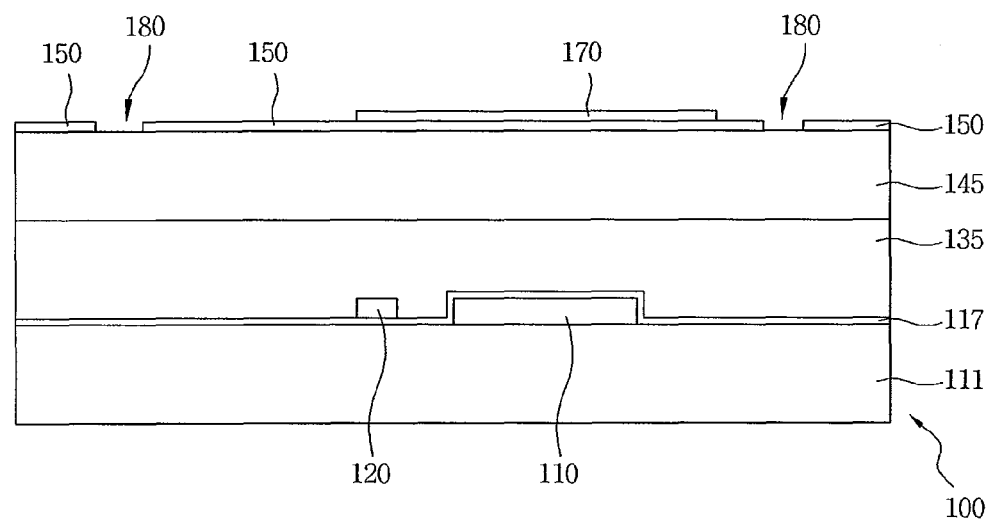

Referring to FIGS. 8A to 8C, a third conductive layer is formed on the first insulation substrate 111 having the second contact hole 195 formed thereon. Further, the third conductive layer is patterned through a photolithography and etching process using a sixth mask to form the pixel electrode 150. The pixel electrode 150 is formed in the pixel region A defined between the data lines 140, and to be spaced apart from adjacent pixel electrodes at a predetermined interval. The pixel region A includes the reflection region B at the central portion thereof through which the gate line 120 and the second electrode pattern 130 pass, and the transmission regions C1 and C2 at two sides of the reflection region B. Each of the pixel sub-electrodes 150B, 150C1 and 150C2 respectively formed in the reflection region B and the transmission regions C1 and C2 are formed in the shape of a rectangle with rounded corners. The pixel sub-electrodes 150B, 150C1 and 150C2 formed in the reflection region B and the transmission regions C1 and C2 are connected electrically through the connection portions 160. The connection portions 160 are formed when the pixel electrode 150 is formed by patterning a fourth conductive layer. Further, the pixel electrode 150 is connected to the drain region 110d through the second contact hole 195. Thus, the pixel electrode 150 functions as the drain electrode. Meanwhile, the fourth conductive layer for forming the pixel electrode 150 and the connection portion 160 is formed of a transparent conductor such as ITO (Indium Tin Oxide) or IZO (Indium Zinc Oxide). Preferably, the cut-away portion 180 is formed in the shape of a circle at each central portion of the pixel sub-electrodes 150C1 and 150C2 in the transmission regions C1 and C2 when patterning the pixel electrode 150. Further, the reflection film 170 is formed on top of the first insulation substrate 111 through a photolithography and etching process using a seventh mask such that the reflection film 170 remains only in the reflection region B. Preferably, the reflection film 170 is formed to be larger than the pixel sub-electrode 150B formed in the reflection region B. Further, it is preferred that the upper surface of the reflection film 170 be curved along the curved portion of the second protection film 145. The reflection film 170 may be in a single- or multiple-layered structure of a metal including at least any one of Ag, Al, Au, Nd and Cu with superior light reflectivity.

The color filter substrate 200 is manufactured separately from the TFT transistor substrate 100. In order to manufacture the color filter substrate 200, the black matrix is formed in the predetermined region of the second substrate 211, i.e., the region that would not overlap the pixel electrode 150 of the TFT substrate 100 when the two substrates are combined. The color filters 230 are formed to overlap the pixel electrode 150 when the two substrates are combined. Further, the overcoat film 240 is formed to even out the step difference between the black matrix 220 and the color filters 230. Thereafter, the common electrode 250 is formed on the color filter substrate 200.

The TFT and color filter substrates 100 and 200 manufactured as described above are bonded by positioning the substrates such that the pixel electrode 150 and the common electrode 250 are as close to each other as possible, and pressing them together. A sealing film may be used for bonding the substrates. Further, spacers may be provided to maintain a desired cell gap between the two substrates. Thereafter, the LCD panel 300 is manufactured by injecting the liquid crystals between the two substrates and sealing the substrates.

In the LCD panel manufactured as described above, if an electric signal required to form an image is applied to the pixel electrode 150 through the TFT of the TFT substrate 100 and a common voltage is applied to the common electrode 250 of the color filter substrate 200, an electric field is formed between the pixel and common electrodes 150 and 250. The alignment of the liquid crystals is changed according to the electric field, and light transmittance changes in accordance with the alignment to display a desired image.

As described above, according to the present invention, a pixel region includes a reflection region located between two transmission regions, and the reflection region is formed in a region in which gate lines and a storage capacitor are formed.

Accordingly, pixel sub-electrodes formed in the two transmission regions do not have to be spaced apart from each other as in the prior art, which uses a bridge region to connect the two transmission regions. By avoiding the use of a bridge region, the invention avoids the undesirable decrease in the aperture ratio.

Further, the reflection region is formed in a region in which the gate lines and the storage capacitor are formed, so that the area of the reflection region can be increased and the area of the pixel region can also be increased.

The scope of the present invention is not limited to the embodiment described and illustrated above but is defined by the appended claims. It will be apparent that those skilled in the art can make various modifications and changes thereto within the scope of the invention defined by the claims. Therefore, the true scope of the present invention should be defined by the technical spirit of the appended claims.

What is claimed is:

1. A thin film transistor (TFT) substrate comprising:
a plurality of gate lines extending in a first direction on an insulation substrate;
a plurality of data lines extending in a second direction that is non-parallel to the first direction;
a pixel electrode formed in a pixel region, wherein the pixel electrode is formed of a transparent conductor and the pixel region is formed between the data lines and has transmission regions separated from each other by a reflection region, and wherein at least one of the gate lines is formed in the reflection region, and wherein the pixel electrode includes pixel sub-electrodes respectively formed in the reflection and transmission regions, each of the pixel sub-electrodes having rounded corners;
a first electrode pattern formed on the substrate;
an active layer connected to the first electrode pattern and connected to the data line across from the gate line; and
a protection film on the active layer,
wherein the pixel electrode extends through the protection film and directly contacts a portion of the active layer.

2. The TFT substrate as claimed in claim 1, wherein the active layer comprises: a source region connected to the data line; a drain region connected to the pixel electrode; and a channel region between the source and drain regions.

3. The TFT substrate as claimed in claim 1, further comprising a second electrode pattern spaced apart from the gate line by a predetermined distance.

4. The TFT substrate of claim 3, wherein the second electrode pattern and the first electrode pattern overlap except for the part of the first electrode pattern that forms the active layer.

5. The TFT substrate of claim 1, wherein the pixel sub-electrodes are connected to one another through a connection portion.

6. The TFT substrate of claim 1, further comprising a cut-away portion in the pixel electrode in the transmission region.

7. The TFT substrate of claim 1, wherein a reflection film is formed on a surface of the pixel electrode in the reflection region.

8. The TFT substrate of claim 1, wherein the protection film includes a first protection film on the active layer and a second protection film on the first protection film.

9. A method of manufacturing a TFT substrate, comprising:
forming an active layer and a first electrode pattern by forming a semiconductor layer on a substrate and patterning the semiconductor layer;
forming a gate line and a second electrode pattern by forming a gate insulation film and a first conductive layer on the substrate and patterning the first conductive layer;
forming a first protection film on the substrate;
forming a first contact hole that extends through the first protection film to the active layer;
forming a data line by forming a second conductive layer on the substrate and patterning the second conductive layer to be connected to the active layer through the first contact hole;
forming a second protection film on the substrate;
forming a second contact hole that extends through the second protection film to the active layer;
forming a pixel electrode by forming a third transparent conductive layer on the substrate and patterning the third transparent conductive layer to be connected to a portion of the active layer through the second contact hole, wherein the pixel electrodes includes pixel sub-electrodes, each of the pixel sub-electrodes having rounded corners, the pixel sub-electrodes being connected to one another through a connection portion; and
forming a reflection film on the pixel electrode,
wherein the pixel electrode extends through the first contact hole and the second contact hole and directly contacts the portion of the active layer.

10. The method of claim 9, wherein forming the second protection film comprises forming a curved section in a part of the second protection film on which the reflection film is formed.

11. The method as claimed in claim 9, further comprising forming a cut-away portion in the pixel electrode.

12. A liquid crystal display, comprising:
a TFT substrate including a plurality of gate lines extending in a first direction on a first insulation substrate, a plurality of data lines extending in a second direction that is nonparallel to the first direction, a pixel electrode formed in a pixel region between the data lines, the pixel region including transmission regions that are separated from each other by a reflection region, and wherein at least one of the gate lines is formed in the reflection region, a first electrode pattern formed on the substrate, an active layer connected to the first electrode pattern and connected to the data line across from the gate line, and a protection film on the active layer, and wherein the pixel electrode includes pixel sub-electrodes respectively formed in the reflection and transmission regions, each of the pixel sub-electrodes having rounded corners, the pixel sub-electrodes being connected to one another through a connection portion, a color filter substrate including:
- a second insulation substrate having a first region that does not overlap the pixel region when the color filter substrate is aligned with the TFT substrate and a second region that overlaps the pixel region when the color filter substrate is aligned with the TFT substrate,
- a black matrix formed in the first region,
- a color filter formed in the second region, and
- a common electrode formed on the second insulation substrate; and a liquid crystal layer interposed between the TFT and color filter substrates, wherein the pixel electrode is formed of a transparent conductor and extends through the protection film and directly contacts a portion of the active layer.

* * * * *